(12) United States Patent
Kim et al.

(10) Patent No.: US 10,295,563 B2
(45) Date of Patent: May 21, 2019

(54) TEST SOCKET FOR SEMICONDUCTOR DEVICE AND TEST DEVICE INCLUDING THE SAME

(71) Applicant: SAMSUNG ELECTRONICS CO., LTD., Suwon-si, Gyeonggi-do (KR)

(72) Inventors: Mi-so Kim, Seoul (KR); Jong-won Han, Cheonan-si (KR)

(73) Assignee: Samsung Electronics Co., Ltd., Suwon-Si, Gyeonggi-do (KR)

(*) Notice: Subject to any disclaimer, the term of this patent is extended or adjusted under 35 U.S.C. 154(b) by 55 days.

(21) Appl. No.: 14/716,344

(22) Filed: May 19, 2015

(65) Prior Publication Data

US 2016/0061861 A1  Mar. 3, 2016

(30) Foreign Application Priority Data

Sep. 1, 2014  (KR) .................. 10-2014-0115689

(51) Int. Cl.
*G01R 1/04* (2006.01)
*G01R 31/28* (2006.01)

(52) U.S. Cl.
CPC ....... *G01R 1/0466* (2013.01); *G01R 31/2863* (2013.01)

(58) Field of Classification Search
None
See application file for complete search history.

(56) References Cited

U.S. PATENT DOCUMENTS

| 5,527,189 | A  |   | 6/1996  | Middlehurst et al. |
| 5,650,660 | A  | * | 7/1997  | Barrow ............... H01L 23/3128 257/668 |
| 5,652,524 | A  | * | 7/1997  | Jennion .............. G01R 31/2801 324/756.07 |
| 5,825,171 | A  | * | 10/1998 | Shin .................... G01R 31/2849 324/73.1 |
| 5,864,470 | A  | * | 1/1999  | Shim, II .............. H01L 23/3677 174/254 |
| 5,923,540 | A  | * | 7/1999  | Asada .................... H01L 23/13 174/51 |
| 6,056,559 | A  |   | 5/2000  | Olson |
| 6,160,705 | A  | * | 12/2000 | Stearns ............. H01L 23/49816 174/252 |
| 6,407,564 | B1 | * | 6/2002  | Tseng ................... G01R 1/0483 324/756.05 |

(Continued)

FOREIGN PATENT DOCUMENTS

| JP | 11-162579     | 6/1999 |
| JP | 2006-216613 A | 8/2006 |

(Continued)

*Primary Examiner* — Paresh H Patel
(74) *Attorney, Agent, or Firm* — Lee & Morse, P.C.

(57) ABSTRACT

Provided are a test socket for a semiconductor device and a test device including the test socket. The test device includes a test socket including terminals arranged in a two-dimensional array and corresponding to terminals of the semiconductor device and a ground line extending along at least one row of two-dimensional array; and a substrate electrically connected to the test socket so as to transmit and receive a test signal. The test socket includes a ground line extending along at least one row of the two-dimensional array.

15 Claims, 12 Drawing Sheets

(56) References Cited

U.S. PATENT DOCUMENTS

| | | | |
|---|---|---|---|
| 6,448,639 B1 * | 9/2002 | Ma | H01L 23/49816 257/690 |
| 6,811,410 B2 | 11/2004 | Figueroa et al. | |
| 7,063,569 B2 | 6/2006 | Figueroa et al. | |
| 7,160,741 B2 * | 1/2007 | Lim | G01R 31/2853 257/48 |
| 7,914,305 B2 | 3/2011 | Amleshi et al. | |
| 8,202,111 B2 | 6/2012 | Kojima | |
| 8,411,002 B2 | 4/2013 | Lee et al. | |
| 8,975,909 B1 * | 3/2015 | Cortez | G01R 1/06722 324/754.01 |
| 2004/0124864 A1 * | 7/2004 | Feld | G01R 1/045 324/750.27 |
| 2012/0003848 A1 | 1/2012 | Casher et al. | |
| 2013/0309912 A1 | 11/2013 | Tai et al. | |

FOREIGN PATENT DOCUMENTS

| | | |
|---|---|---|
| JP | 5026623 B2 | 6/2012 |
| KR | 10-2002-0064416 A | 8/2002 |
| KR | 10-2009-0093076 A | 9/2009 |
| KR | 10-1256927 B1 | 4/2013 |

* cited by examiner

TEST SOCKET FOR SEMICONDUCTOR DEVICE AND TEST DEVICE INCLUDING THE SAME

CROSS-REFERENCE TO RELATED APPLICATION

Korean Patent Application No. 10-2014-0115689, filed on Sep. 1, 2014, in the Korean Intellectual Property Office, and entitled: "Test Socket for Semiconductor Device and Test Device Including the Same," is incorporated by reference herein in its entirety.

BACKGROUND

1. Field

Embodiments relate to a test socket for semiconductor devices and a test device including the test socket.

2. Description of the Related Art

A semiconductor apparatus manufactured through general semiconductor production processes has to undergo various tests in order to check its reliability. Such tests generally include an electrical property test for checking the semiconductor apparatus with regard to the electrical characteristics and defects thereof.

SUMMARY

Embodiments are directed to a test device, including a test socket having a first surface that comes in contact with a semiconductor device to be tested, a second surface opposite the first surface, and a two-dimensional array of terminals that correspond to terminals of the semiconductor device, the test socket including a ground line extending along at least one row of the terminals in the two-dimensional array of the terminals, and a substrate electrically connected to the test socket so as to transmit and receive a test signal.

The ground line may be electrically connected to a ground terminal of the test device.

The two-dimensional array may have an external square shape, and the ground line may extend along at least a part of the external square shape of the two-dimensional array.

The ground line may surround the external square shape of the two-dimensional array.

The ground line may include a first portion positioned along at least a part of the external square shape of the two-dimensional array and a second portion branching from the first portion and extending in a non-parallel direction with the first portion.

The ground line may include two or more second portions.

The second portion may branch perpendicularly from the first portion.

The second portion may extend between the terminals.

The terminals arranged in the two-dimensional array may include a ground terminal, and one signal terminal may be located between the ground line and the ground terminal.

A line connecting the ground terminal and the signal terminal may be perpendicular to the ground line.

A line connecting the ground terminal and the signal terminal may be inclined with respect to the ground line.

The terminals arranged in the two-dimensional array may include a ground terminal, and one signal terminal may be located between the ground line and the ground terminal, and a distance between the signal terminal and the ground line may be about 0.5 times to 5 times a pitch between the terminals.

The terminals arranged in the two-dimensional array of the test socket may surround a blank region where no terminal is arranged, and the ground line may extend along an external area of the blank region.

The ground line may surround the blank region.

The ground line may include a third portion along at least a part of the external area of the blank region, and a fourth portion branching from the third portion and extending in a non-parallel direction with the third portion.

The ground line may extend between two adjacent columns of the two-dimensional array.

The ground line may include a fifth portion extending between two adjacent columns of the two-dimensional array, and a sixth portion branching from the fifth portion and extending between other two adjacent columns of the two-dimensional array.

The ground line may further include a seventh portion branching from the fifth portion in a direction opposite a direction in which the sixth portion extends.

The sixth portion and the seventh portion may be branching from a point on the fifth portion in opposite directions to each other.

Embodiments are also directed to a test socket, including a first surface that comes in contact with a semiconductor device to be tested and a second surface opposite the first surface, terminals arranged in a two-dimensional array and corresponding to terminals of the semiconductor device, the terminals including at least one ground terminal, and a ground line that extends along at least one row of the two-dimensional array, the ground line being electrically connected to the at least one ground terminal.

The terminals may surround a blank region where no terminals are arranged, and the ground line may extend between an external area of the blank region and the terminals.

The ground line may include a first portion along at least a part of the external area of the blank region, and a second portion branching from the first portion and extending in a non-parallel direction with the first portion.

The second portion may extend between the terminals of the test socket.

Embodiments are also directed to a test device for testing a semiconductor device, the test device including a test main body for testing the semiconductor device, and a test control unit for controlling a test performed via the test main body, the test main body including a test substrate and a test socket on the test substrate, the test socket including a first surface that comes in contact with the semiconductor device to be tested and a second surface opposite the first surface, and including terminals arranged in a two-dimensional array and corresponding to terminals of the semiconductor device. The terminals of the test socket may include at least one ground terminal. A ground line that extends along at least one row of the two-dimensional array may be electrically connected to the at least one ground terminal.

Embodiments are also directed to a method of testing a semiconductor device, the method including mounting the semiconductor device on a test socket that includes terminals arranged in a two-dimensional array and a ground line extending along at least one row in the two-dimensional array, grounding the ground line, and performing a test by inputting a test signal to the semiconductor device via the test socket.

The terminals may include at least one ground terminal and at least one signal terminal located between the at least one ground terminal and the ground line.

A transmission loss of the signal transmitted through the at least one signal terminal may be higher than a transmission loss of a signal transmitted when the test socket includes no ground line.

Embodiments are also directed to a testing apparatus, including a jig and a socket, the jig applying a force in a first direction so as to temporarily fix a device under test (DUT) against the socket, the socket including exposed socket terminals, a plurality of the socket terminals being arranged so as to align with corresponding conductive features exposed on the DUT, the socket including a ground element extending in a second direction normal to the first direction, the ground element extending continuously in the second direction beside at least two of the plurality of socket terminals, the testing apparatus applying a test signal to at least one of the conductive features via a corresponding socket terminal while simultaneously coupling the ground element to a ground.

The socket terminals may be exposed at a first surface of the socket, and the ground element may be disposed at the first socket.

The socket may include a plurality of ground terminals, the ground element connecting the ground terminals together, the ground terminals being arranged beside the plurality of socket terminals.

BRIEF DESCRIPTION OF THE DRAWINGS

Features will become apparent to those of skill in the art by describing in detail example embodiments with reference to the attached drawings in which.

DETAILED DESCRIPTION

Figure 1:
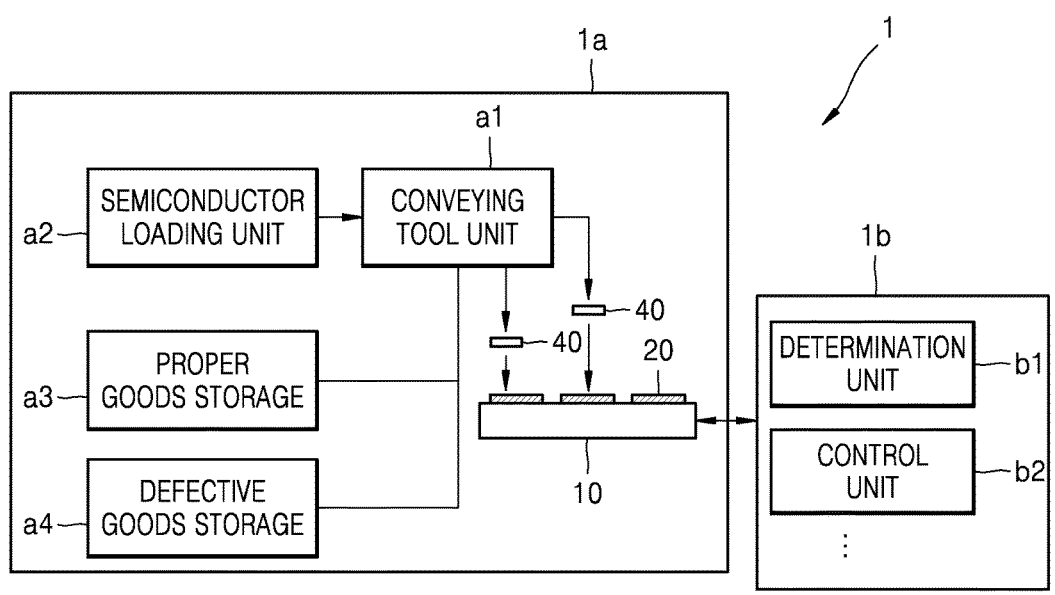
FIG. 1 illustrates a block diagram showing a test device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings. For example, a first element may be designated as a second element, and similarly, a second element may be designated as a first element without departing from the teachings.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a test device 1 according to an example embodiment.

Referring to FIG. 1, the test device 1 may include a test main body 1a and a test control unit 1b for controlling test performed by the test main body 1a.

The test main body 1a is a portion for loading and conveying of a semiconductor device 40 to be tested and sorting of proper goods and defective goods, and is referred to as a 'test handler unit'. Also, the test control unit 1b transmits electric signals to the test main body 1a to determine whether the semiconductor device 40 is a proper good.

In the present example embodiment, the test main body 1a includes a test substrate 10 on which a test socket 20 is provided, a semiconductor loading unit a2 for loading and storing a semiconductor device, and a conveying tool unit a1 conveying the semiconductor device in the semiconductor loading unit a2 to the test socket 20 on the test substrate 10 to be in contact with the test socket 20.

The conveying tool unit a1 conveys a semiconductor chip that has been tested on the test substrate 10 to a proper goods storage a3 or a defective goods storage a4. Here, determination of whether the tested semiconductor device is defective or not is performed by the test control unit 1b, and according to the determination of the test control unit 1b, the conveying tool unit a1 sorts the semiconductor device into the proper goods or the defective goods and conveys the semiconductor device to the proper goods storage a3 or the defective goods storage a4.

An operator accommodates semiconductor devices 40 to be tested in, for example, accommodation compartments of a tray to locate the semiconductor devices 40 in the semiconductor loading unit a2 of the test main body 1a. Subsequent test processes may be performed automatically, that is, the conveying tool unit a1 conveys the semiconductor devices 40 on the tray onto the test socket 20 of the test substrate 10 to be in contact with the test socket 20. In addition, the test control unit 1b transmits an electric signal to the test socket 20 to determine whether the semiconductor devices 40 are defective. The test main body 1a, receiving a determination result, places the proper goods in the proper goods storage a3 and the defective goods in the defective goods storage a4 by using the conveying tool unit a1 included therein, and then, the test is finished.

Figure 2:
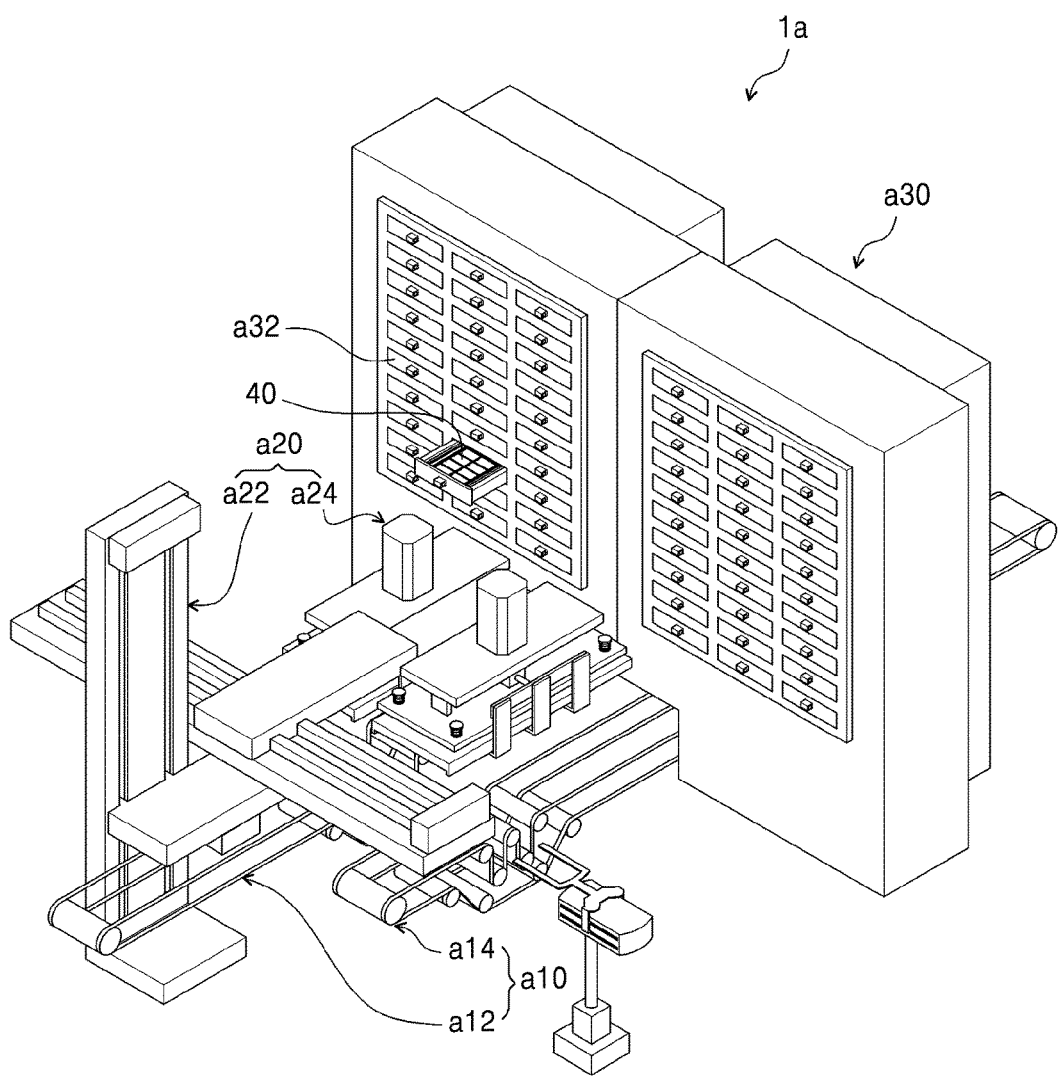
FIG. 2 illustrates a perspective view of a main body of the test device according to the present example embodiment.

FIG. 2 is a perspective view of the test main body 1a included in the test device 1 according to the present example embodiment.

Referring to FIG. 2, the test main body 1a may include a conveyor unit a10, a transfer unit a20, and a test unit a30.

The conveyor unit a10 may convey the semiconductor device 40. The conveyor unit a10 may include a supply conveyor a12 and a discharge conveyor a14. The supply conveyor a12 conveys the semiconductor device 40 to the transfer unit a20. The discharge conveyer a14 may transfer the semiconductor device 40 from the transfer unit a20 to an unloader.

The transfer unit a20 may load and/or unload the semiconductor device 40 to be tested onto/from the test unit a30. The transfer unit a20 may include a lift unit a22 and a robot unit a24. The lift unit a22 may elevate the semiconductor device 40 between the supply conveyer a12 and the robot unit a24. The robot unit a24 may transfer the semiconductor device 40 between the lift unit a22 and the test unit a30.

The test unit a30 provides the semiconductor device 40 with a test environment and a test space. The test unit a30 may include, for example, a drawer a32, and one or more semiconductor devices 40 may be accommodated in the drawer a32. The robot unit a24 may open or close the drawer a32 of the test unit a30. In FIG. 2, the test unit a30 has the drawer structure, but is not limited thereto.

Figure 3:
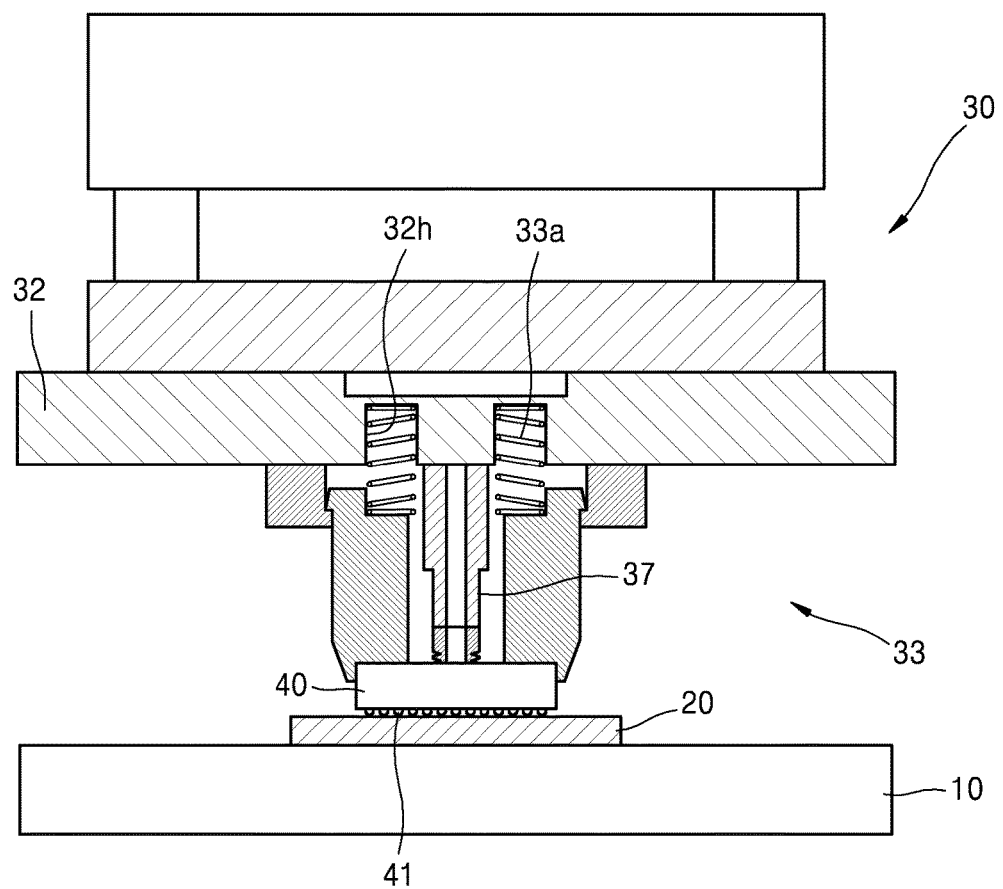
FIG. 3 illustrates a side-sectional view illustrating an apparatus and method of testing a semiconductor device, according to an example embodiment.

FIG. 3 is a side-sectional view illustrating an apparatus and method of testing the semiconductor device 40 according to an example embodiment.

Referring to FIG. 3, the test device for testing the semiconductor device 40 may include a jig applying a force in a first direction so as to temporarily fix a device under test (DUT), for example, semiconductor device 40, against test socket 20. For example, the test device may be configured so that the test socket 20 is disposed on the test substrate 10 and the semiconductor device 40 placed on the test socket 20 may be compressed downwardly by using a pusher device 30. The pusher device 30 compresses the semiconductor device 40 downwardly, and terminals 41 of the semiconductor device 40 may firmly contact terminals of the test socket 20.

The pusher device 30 may include a support plate 32, a guide member 33, and a pushing member 37.

The support plate 32 supports the guide member 33 and the pushing member 37, and a plurality of receiving recesses 32h that receive upper ends of elastic members 33a of the guide member 33 may be formed in a lower surface of the support plate 32. The elastic members 33a are received in the receiving recesses 32h, and may be prevented from escaping the receiving recesses 32h.

The guide member 33 is disposed on the lower surface of the support plate 32, and the pushing member 37 is provided on the lower surface of the support plate 32 in a state of being inserted in a center hole of the guide member 33 in order to push the semiconductor device 40 so that the terminal 41 of the semiconductor device 40 may firmly contact the terminal of the test socket 20.

Figure 4:
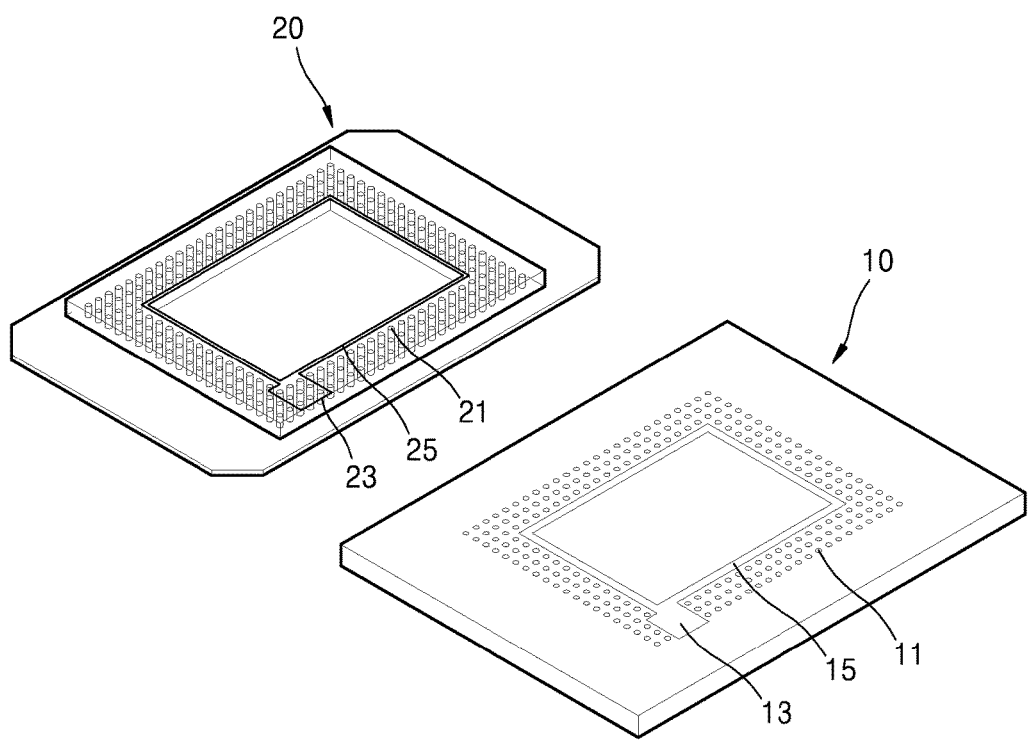
FIG. 4 illustrates a perspective view of a test substrate of FIG. 3 and a test socket disposed on the test substrate.

FIG. 4 is a perspective view of the test substrate 10 and the test socket 20 disposed on the test substrate 10 of FIG. 3.

Referring to FIG. 4, the test socket 20 is located on the test substrate 10. The test substrate 10 and the test socket 20 may respectively have an array of terminals that are arranged two-dimensionally. In addition, the terminals of the test substrate 10 and the terminals of the test socket 20 may correspond to each other.

In particular, the test substrate 10 may be, for example, a printed circuit board (PCB). A plurality of terminals 11 may be arranged two-dimensionally on an upper surface of the test substrate 10. The plurality of terminals 11 may be formed of metal such as nickel, copper, and aluminum, or a metal alloy, and may be electrically connected to wires extending in the test substrate 10 or extending along the surface of the test substrate 10.

The plurality of terminals 11 may include at least one ground terminal. Also, the test substrate 10 may have a ground line 15 extending along at least one line of the terminals 11 that are arranged two-dimensionally. The ground line 15 may be provided on the upper surface of the test substrate 10.

The test substrate 10 may further include a ground extension portion 13 connecting the ground line 15 to the ground terminal. The ground extension portion 13 may be partially connected to the ground line 15. Also, the ground extension portion 13 may be electrically connected to the ground terminal.

The test socket 20 may be formed by arranging a plurality of terminals 21 two-dimensionally on a hard substrate or a soft substrate having elasticity. The hard or soft substrate may be electrically insulating, and the plurality of terminals 21 may penetrate through the substrate. Also, the plurality of terminals 21 may be electrically conductive, and may be formed of, for example, metal such as nickel, copper, aluminum, and silver, or a metal alloy. In another implementation, the plurality of terminals 21 may be electrically semi-conductive. For example, the terminal 21 may be formed by dispersing electrically conductive particles in a matrix of an insulating elastic body. In this case, if a pressure is not applied, the electrically conductive particles may be electrically insulated with each other by the electrically insulating matrix, but if a pressure is applied, the electrically conductive particles may adhere and contact each other to form an electrically conductive path.

Also, the terminals 21 may electrically connect the terminals of the semiconductor device 40 placed thereon to the test substrate 10 located under the terminals 21.

The plurality of terminals 21 may include at least one ground terminal. Also, the test socket 20 may have a ground line 25 extending along at least one line of the terminals 21 that are two-dimensionally arranged. The ground line 25 may be provided on an upper surface of the test socket 20.

The test socket 20 may further include a ground extension portion 23 connecting the ground line 25 to the ground terminal. The ground extension portion 23 may be partially connected to the ground line 25. In addition, the ground extension portion 23 may be electrically connected to the ground terminal.

Figure 5:
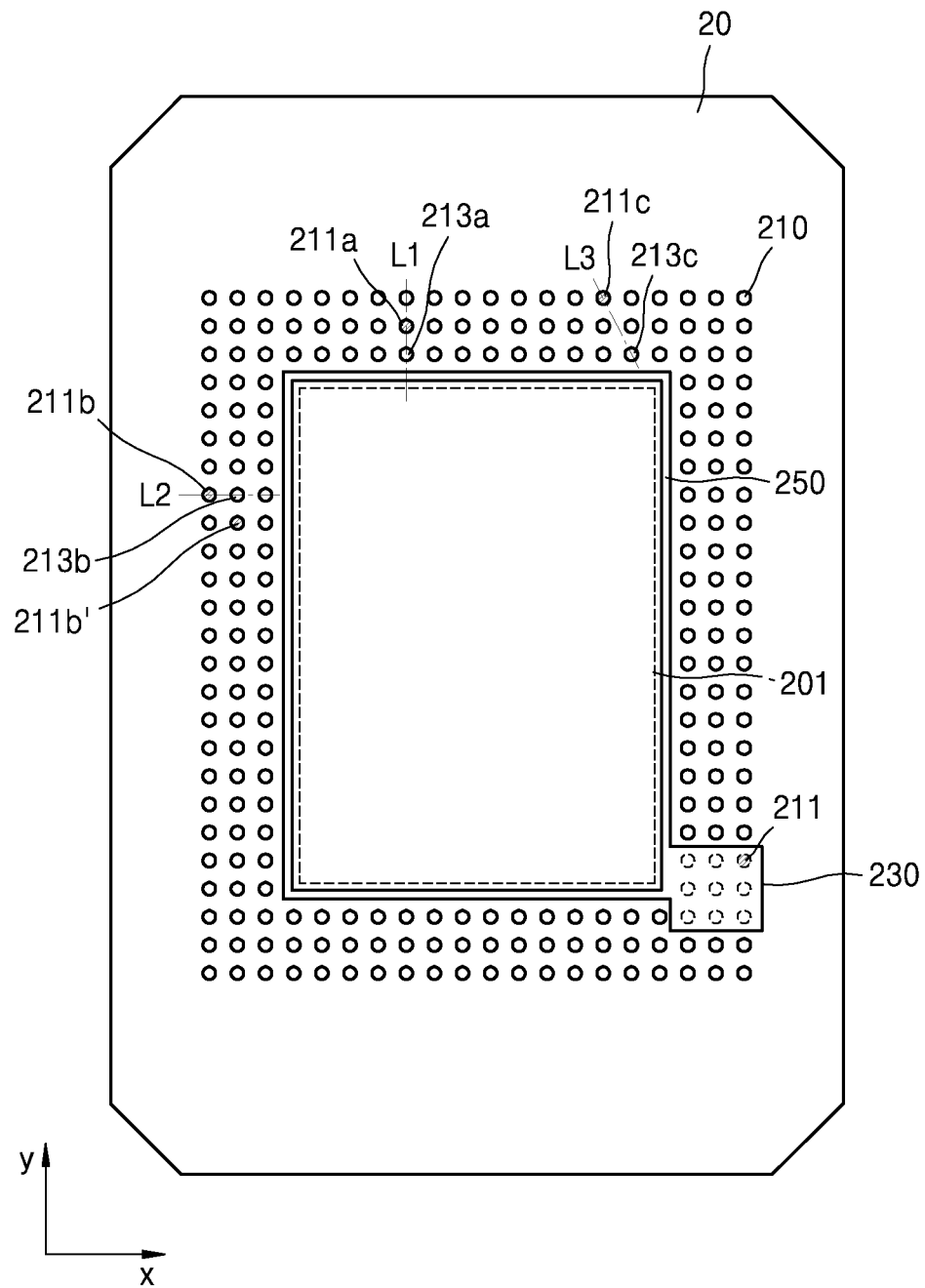
FIGS. 5 through 11 illustrate plan views showing terminals of the test socket according to example embodiments.

FIG. 5 is a plan view of an array of terminals 210 in the test socket 20 according to the present example embodiment.

Referring to FIG. 5, the test socket 20 includes an array of terminals 210 that are arranged two-dimensionally to correspond to arrangement of terminals of a semiconductor device to be tested. The terminals 210 may be arranged to have constant pitches in an x-axis direction. Also, the terminals 210 may be also arranged to have constant pitches in a y-axis direction. The pitches in the x-axis direction and the pitches in the y-axis direction may be the same as or different from each other.

The arrangement of the terminals 210 shown in FIG. 5 is an example, and one or more example embodiments are not limited thereto. That is, sizes, the number, and intervals of the terminals may be different from those of FIG. 5. In addition, the arrangement of the terminals 210 may have a square external appearance, but is not limited thereto.

The terminals 210 may have one or more ground terminals 211, 211a, 211b, and 211c. In addition, the terminals 210 may have one or more signal terminals 213a, 213b, and 213c. Locations of the ground terminals 211, 211a, 211b, and 211c and the signal terminals 213a, 213b, and 213c in FIG. 5 are examples, and are not limited thereto.

As shown in FIG. 5, the array of the terminals 210 may surround a blank region 201 in which the terminals 210 are not arranged. The blank region 201 is formed as a square, but is not limited thereto. For example, the blank region 201 may have a corner that is recessed because an additional terminal is disposed thereon.

The test socket 20 may have a ground line 250 that extends along with at least one line of the two-dimensional array of the terminals 210. The ground line 250 may extend to a ground terminal 211 via a ground extension portion 230. Thus, the ground line 250 may be electrically connected to a ground of the test device 1 via a ground terminal of the test substrate 10.

The ground line 250 may not be necessarily a combination of straight lines, but may include curves, for example.

As described above, the terminals 210 arranged as the two-dimensional array may include the ground terminals 211, 211a, 211b, and 211c and the signal terminals 213a, 213b, and 213c. As shown in FIG. 5, the ground terminals 211, 211a, 211b, and 211c and the signal terminals 213a, 213b, and 213c may be disposed on various locations, and this will be described below.

The ground terminal 211a and the signal terminal 213a are adjacent to each other. In particular, the signal terminal 213a is adjacent to the ground line 250 in a direction opposite to the ground terminal 211a. In addition, a straight line L1 connecting the ground terminal 211a and the signal terminal 213a may be perpendicular to an extending direction of the ground line 250. The signal terminal 213a is disposed between the ground terminal 211a and the ground line 250, and intervals between the signal terminal 213a, the ground terminal 211a, and the ground line 250 may be substantially the same as the pitches between the terminals 210.

The ground terminal 211a and the ground line 250 are located at opposite sides of the signal terminal 213a. Thus, signal characteristic of the signal terminal 213a may be greatly improved. The signal characteristic may be characterized by a transmission loss, for example. That is, if there were no ground line 250, the signal terminal 213a would have the ground terminal 211a at only a side, and thus, the signal characteristic would be relatively inferior. However, when the ground line 250 is added, the signal terminal 213a has the ground terminal and/or the ground line at opposite sides thereof, and thereby improving signal characteristic.

The ground terminal 211b and the signal terminal 213b are adjacent to each other, but the signal terminal 213b is separated apart from the ground line 250 by about two pitches. A straight line L2 connecting the ground terminal 211b and the signal terminal 213b may be perpendicular to an extending direction of the ground line 250. Although there is another ground terminal 211b' that is adjacent to the signal terminal 213b, the ground terminal 211b' is off from an opposite direction of the ground terminal 211b based on the signal terminal 213b, there is a limitation in improving the signal characteristic of the signal terminal 213b.

However, in this case, the ground terminal 211a and the ground line 250 are respectively located on opposite sides of the signal terminal 213a, and thus, the signal characteristic of the signal terminal 213a may be improved. Although the signal characteristic may be further improved when the ground line 250 is closer to the signal terminal 213b, the signal characteristic may be superior to that of a case where the ground line 250 does not exist.

The ground terminal 211c and the signal terminal 213c may not be adjacent to each other. A distance of the ground terminal 211c and the signal terminal 213c may be two or three times greater than the pitch between two adjacent terminals. In addition, a straight line L3 connecting the ground terminal 211c and the signal terminal 213c may not be perpendicular to or in parallel with the extending direction of the ground line 250, but may be inclined with respect to the extending direction of the ground line 250.

Also, since the ground line 250 extends to be adjacent to the signal terminal 213c, an effect of improving the signal characteristic to a certain extent is shown due to the existence of the ground terminal 211c and the ground line 250. That is, if there were no ground line 250, there would be only the ground terminal 211c close to the signal terminal 213c with a distance that is two to three times greater than the pitch between the terminals, and thus, the signal characteristic may be degraded. However, when the ground line 250 is disposed adjacent to the signal terminal 213c, the ground terminal and/or the ground line are disposed on the opposite sides of the signal terminal 213c at predetermined distances, and thereby improving the signal characteristic.

The distance between the signal terminals 213a, 213b, and 213c and the ground line 250 may be about 0.5 times to about 5 times the pitch between the terminals 210 forming the two-dimensional array.

The arrangement of terminals of the test substrate 10, on which the test socket 20 is mounted, may correspond to the arrangement of the terminals of the test socket 20, but is not limited thereto.

Figure 6:
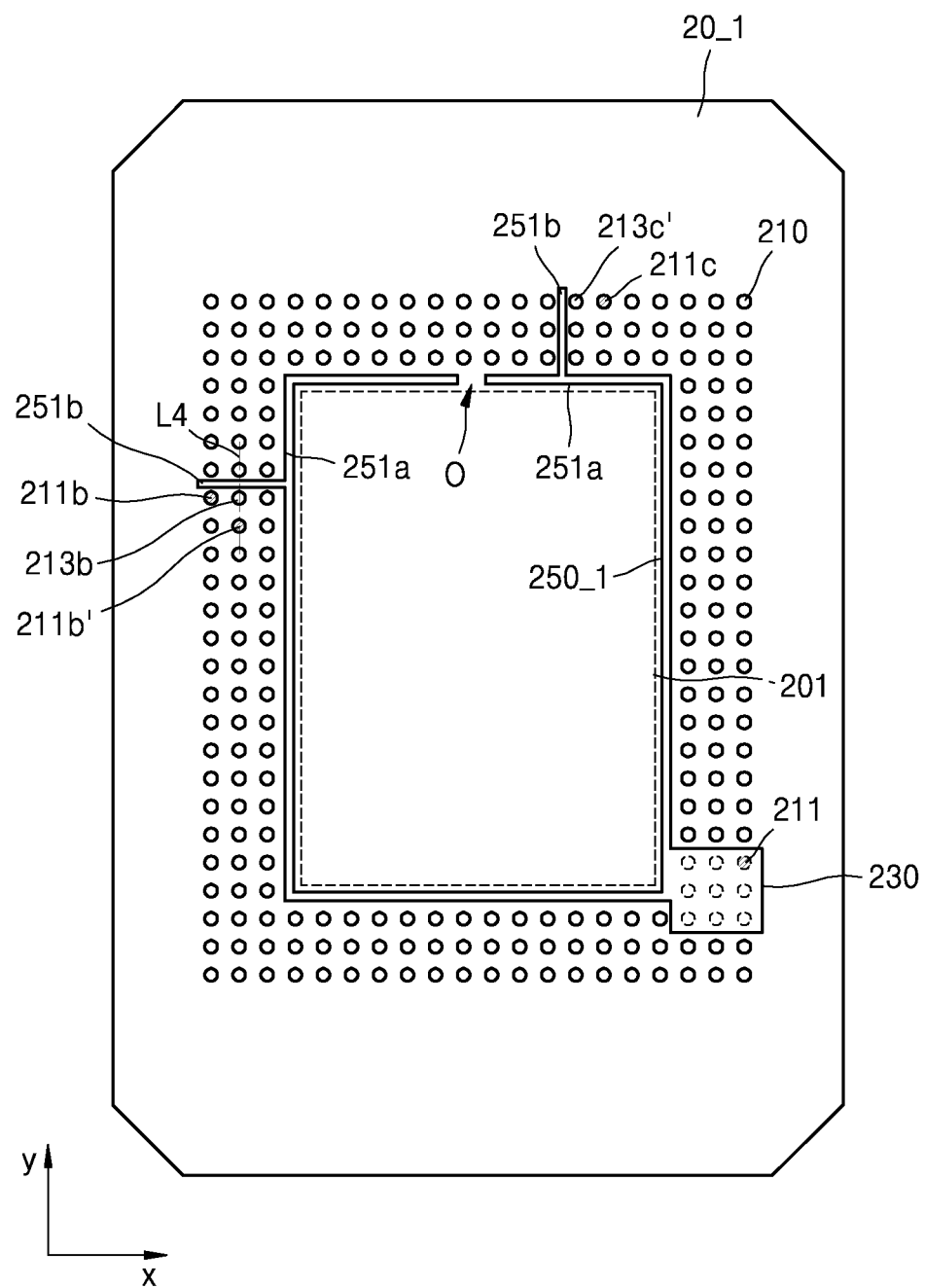

FIG. 6 is a plan view of an array of the terminals 210 in a test socket 20_1 according to another example embodiment.

Referring to FIG. 6, a ground line 250_1 is not closed so as to completely surround the blank region 201, but may have a disconnected portion O.

Also, the ground line 250_1 may include a first portion 251a extending along at least a part of the blank region 201, and second portions 251b extending after being branched from the first portion 251a. The ground line 250_1 may include two or more second portions 251b.

Directions in which the second portions 251b extend may not be in parallel with an extending direction of the first portion 251a, and for example, may be perpendicular to the extending direction of the first portion 251a. The second portions 251b may extend to exterior of the terminals 210.

In the present example embodiment shown in FIG. 5, the signal characteristic of the signal terminal 213b is improved by the ground terminal 211b and the ground line 250, and the ground terminal 211b' may hardly contribute to the improving of the signal characteristic of the signal terminal 213b. However, because the second portions 251b extending from the first portion 251a of the ground line 250_1, the signal terminal 213b may be located between the ground terminal 211b' and the ground line 250, and accordingly, the signal characteristic may be improved.

In FIG. 6, the second portion 215b is adjacent to the signal 213b, but the signal characteristic may be improved with the second portion 251b located within a distance from the signal terminal, wherein the distance is three times greater than the pitch between the terminals 210.

The signal terminal 213c' may be disposed adjacent to the ground terminal 211c at a lateral direction of the x-axis direction. The ground terminal 211c or the ground line 250_1 may not contribute to the improving of the signal characteristic of the signal terminal 213c', unless there is the second portion 251b extending in the y-axis direction. However, in the present example embodiment, the signal terminal 213c' may be located between the ground line 250_1 and the ground terminal 211c due to the second portion 251b extending in the y-axis direction, and accordingly, the signal characteristic may be improved.

The arrangement of the terminals in the test substrate 10, on which the test socket 20_1 is mounted, may correspond to the arrangement of the terminals 210 of the test socket 20_1, but is not limited thereto.

Figure 7:
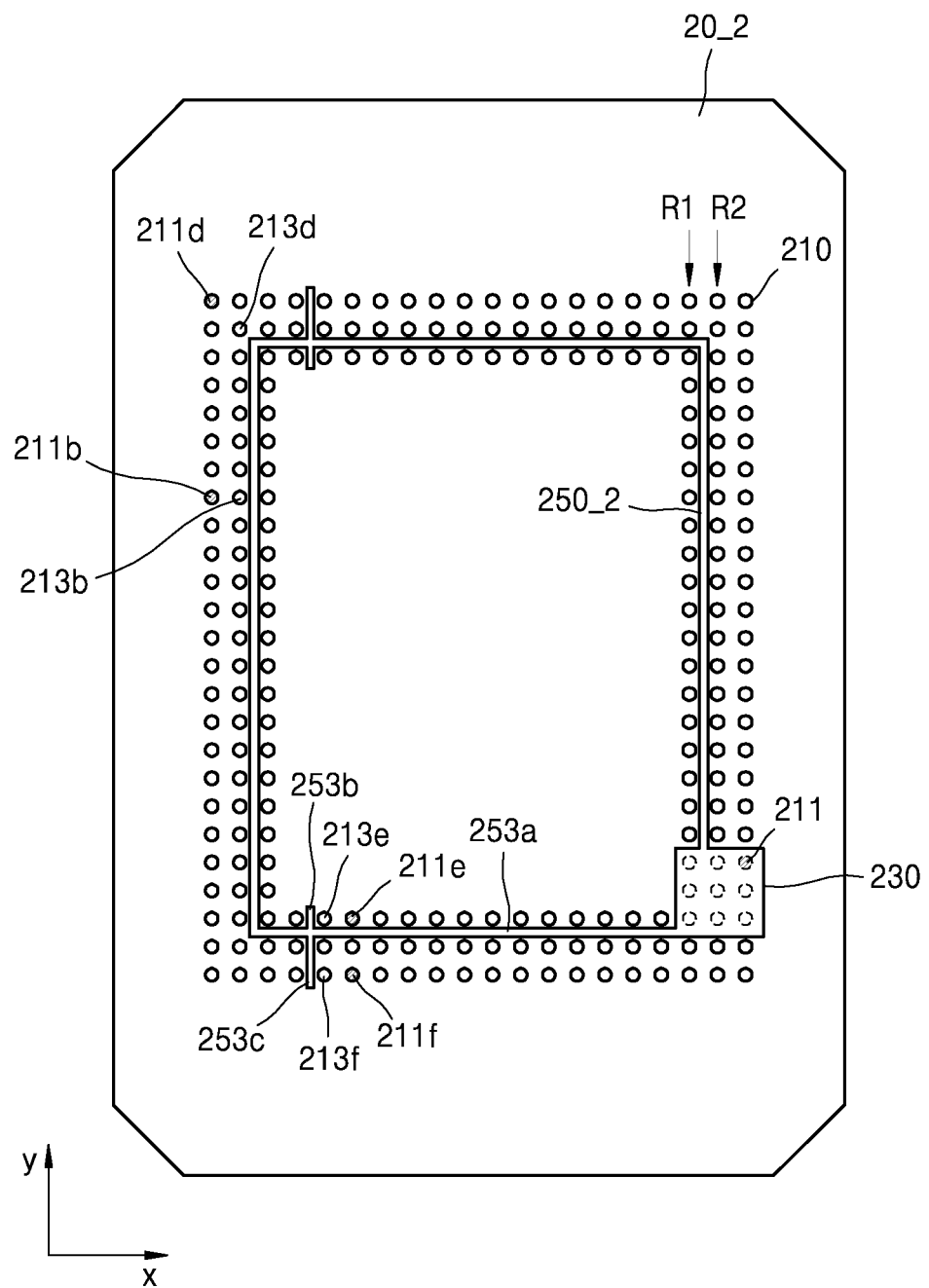

FIG. 7 is a plan view of an array of the terminals 210 of a test socket 20_2 according to another example embodiment.

Referring to FIG. 7, a ground line 250_2 may extend between two adjacent columns of the terminals 210 from among the terminals 210 arranged two-dimensionally. That is, the ground line 250_2 extends from the ground extension portion 230 between two adjacent columns R1 and R2 of the terminals 210. That is, the ground line 250_2 may extend between a first column R1 and a second column R2 of the terminals 210.

When the ground terminal 211d and the signal terminal 213d are located at a corner of the array as shown in FIG. 7, the distance between the ground line 250_2 and the signal terminal 213d may be reduced, and thus, the signal characteristic may be further improved.

In addition, in a case of the signal terminal 213b that is spaced apart from the blank region 201, the ground line 250_2 is formed as shown in FIG. 7, and thus, the ground line 250_2 is located right next to the signal terminal 213b. Thus, the signal characteristic of the signal terminal 213b may be greatly improved.

Also, as shown in FIG. 7, the ground line 250_2 may include a first portion 253a extending between two adjacent columns of the terminals from among the terminals 210 arranged two-dimensionally, and a second portion 253b branched from the first portion 253a. Moreover, the ground line 250_2 may further include a third portion 253c branched from the first portion 253a in a direction opposite to the extending direction of the second portion 253b. Here, the second portion 253b and the third portion 253c may be branched from the same part of the first portion 253a to different directions that are slanted with respect to each other or opposite to each other.

Due to the second portion 253b and the third portion 253c, the signal characteristics of the signal terminals 213e and 213f that may not be affected by the first portion 253a may be improved.

In particular, although the ground terminal 211e is located adjacent to the signal terminal 213e, there is no ground terminal on an opposite side of the ground terminal 211e, and thus, the signal characteristic may be inferior to those of other signal terminals. However, when the second portion 253b is formed, the signal terminal 213e may be located between the ground terminal 211e and the second portion 253b, and thus, the signal characteristic of the signal terminal 213e may be improved.

Also, although the ground terminal 211f is adjacent to the signal terminal 213f, there is no ground terminal on an opposite side of the ground terminal 211f, and thus, the signal characteristic of the signal terminal 213f may be inferior to those of other signal terminals. However, when the third portion 253c is formed, the signal terminal 213f may be located between the ground terminal 211f and the second portion 253c, and thus, the signal characteristic of the signal terminal 213f may be improved.

Arrangement of the terminals in the test substrate 10, on which the test socket 20_2 is mounted, may correspond to the arrangement of the terminals 210 of the test socket 20_2, but is not limited thereto.

Figure 8:
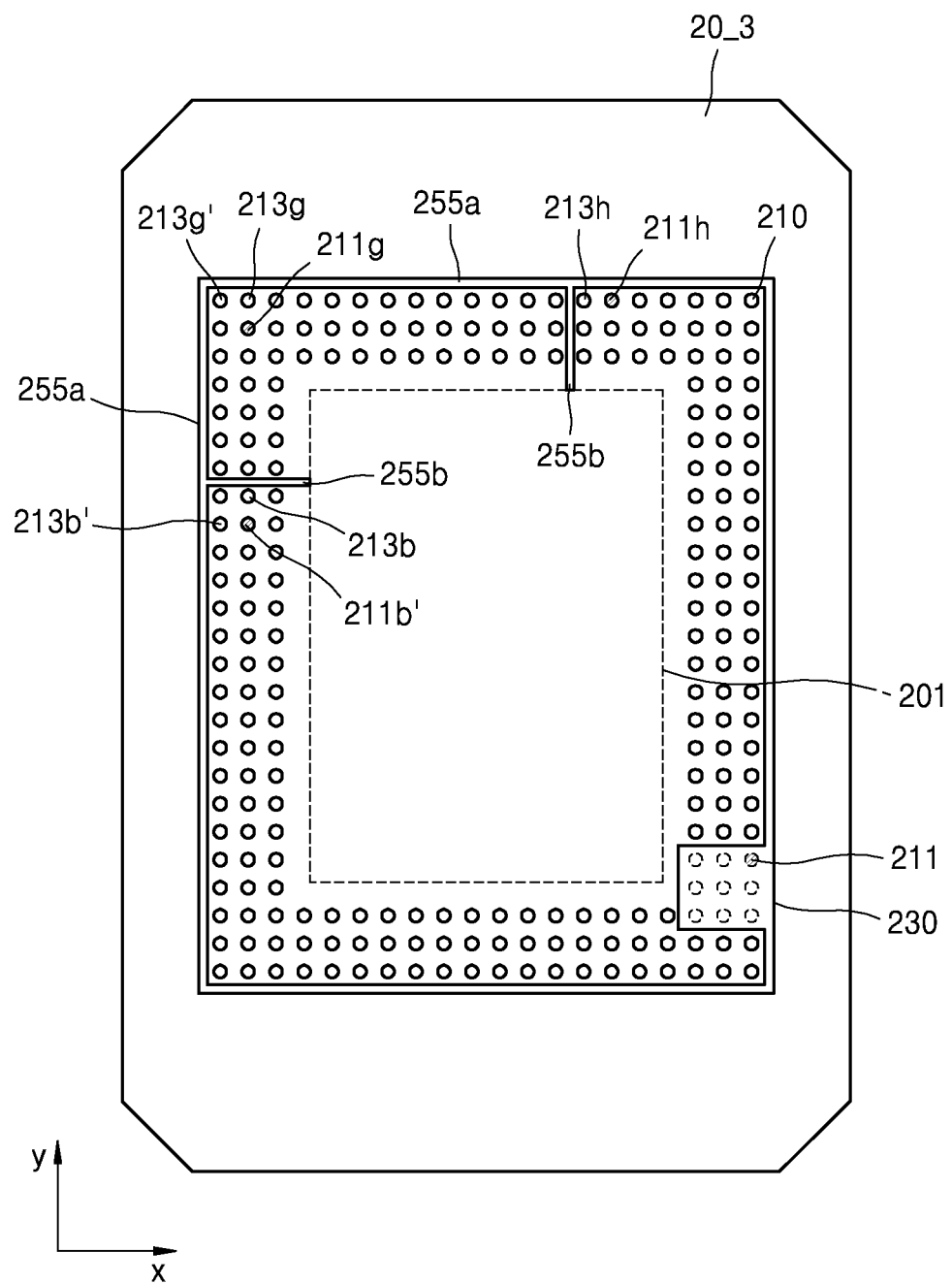

FIG. 8 is a plan view of an array of the terminals 210 of a test socket 20_3 according to another example embodiment.

Referring to FIG. 8, the ground line 250_3 may extend along with exterior of the terminals 210 forming a two-dimensional array. Moreover, the ground line 250_3 extends along the exterior of the terminals 210 to surround the terminals 210, and may have a closed shape.

When configuring the ground line 250_3 as shown in FIG. 8, signal characteristic of the signal terminals that are located at corners or at the outermost parts may be improved greatly. As shown in FIG. 8, signal terminals 213b' and 213g are located at the outermost part and a signal terminal 213g' is located at the corner, and thus, the signal characteristics of the signal terminals 213b', 213g, and 213g' may not be improved only by the ground lines 250, 250_1, or 250_2 shown in FIGS. 5 through 7.

However, in the present example embodiment of FIG. 8, since the ground line 250_3 is disposed along with the exterior of the terminals 210, the signal terminals 213b' and 213g at the outermost part may be located between ground terminals 211b' and 211g and the ground line 250_3, and accordingly, the signal characteristics of the signal terminals 213b' and 213g may be greatly improved. Also, the signal terminal 213g' located at the corner may be located between the ground terminal 211g and the ground line 250_3 in a diagonal direction, the signal characteristic of the signal terminal 213g' may be greatly improved.

Also, the ground line 250_3 may include a first portion 255a extending along at least a part of the exterior of the terminals 210 forming the two-dimensional array, and second portions 255b branched from the first portion 255a and extending in a direction that is not in parallel with the first portion 255a.

The ground line 250_3 may include two or more second portions 255b that may be perpendicular to the first portion 255a. However, one or more example embodiments are not limited thereto, that is, the second portions 255b may be branched from the first portion 255a at an angle less than 90° with respect to the first portion 255a.

Also, the second portions 255b may extend between the terminals 210 included in the two-dimensional array. In addition, the second portions 255b may extend to a boundary of the blank region 201.

As described above, signal characteristics of the signal terminals 213b' and 213g that are located at the outermost portion may be improved by the ground line 250_3 and the ground terminals 211b' and 211g that are located opposite to the ground line 250_3. However, there may be a signal terminal 213h that is located at the outermost part, but there is no ground terminal within an appropriate distance in a direction toward the center of the two-dimensional array. Also, there may be a signal terminal 213*b* that is not located at the outermost part and there is no ground terminal within an appropriate distance in a direction toward the center of the two-dimensional array.

In this case, ground terminals 211*b'* and 211*h* that are closest to the signal terminals 213*b* and 213*h* are searched for, and then, the second portions 255*b* may be formed to be respectively adjacent to the signal terminals 213*b* and 213*h* at an opposite side to the ground terminals 211*b'* and 211*h* based on the signal terminals 213*b* and 213*h*.

Thus, signal characteristics of the signal terminals 213*b* and 213*h* that are not affected by the first portion 255*a* may be improved due to the second portions 255*b*.

In particular, although the ground terminal 211*b'* is adjacent to the signal terminal 213*b*, a ground terminal is not located at the opposite side to the ground terminal 211*b'*, and thus, the signal characteristic of the signal terminal 213*b* may be inferior to those of other signal terminals. However, when the second portions 255*b* are formed, the signal terminal 213*b* may be located between the ground terminal 211*b'* and the second portion 255*b*, and thus, the signal characteristic of the signal terminal 213*b* may be improved.

Also, although the ground terminal 211*h* is adjacent to the signal terminal 213*h*, there is no ground terminal at the opposite side to the ground terminal 211*h*, and thus, the signal characteristic of the signal terminal 213*h* may be inferior to those of other signal terminals. However, when the second portion 255*b* are formed, the signal terminal 213*h* may be located between the ground terminal 211*h* and the second portion 255*b*, and thus, the signal characteristic of the signal terminal 213*h* may be improved.

Arrangement of terminals of the test substrate 10, on which the test socket 20_3 is mounted, may correspond to the arrangement of the terminals 210 in the test socket 20_3, but is not limited thereto.

Figure 9:
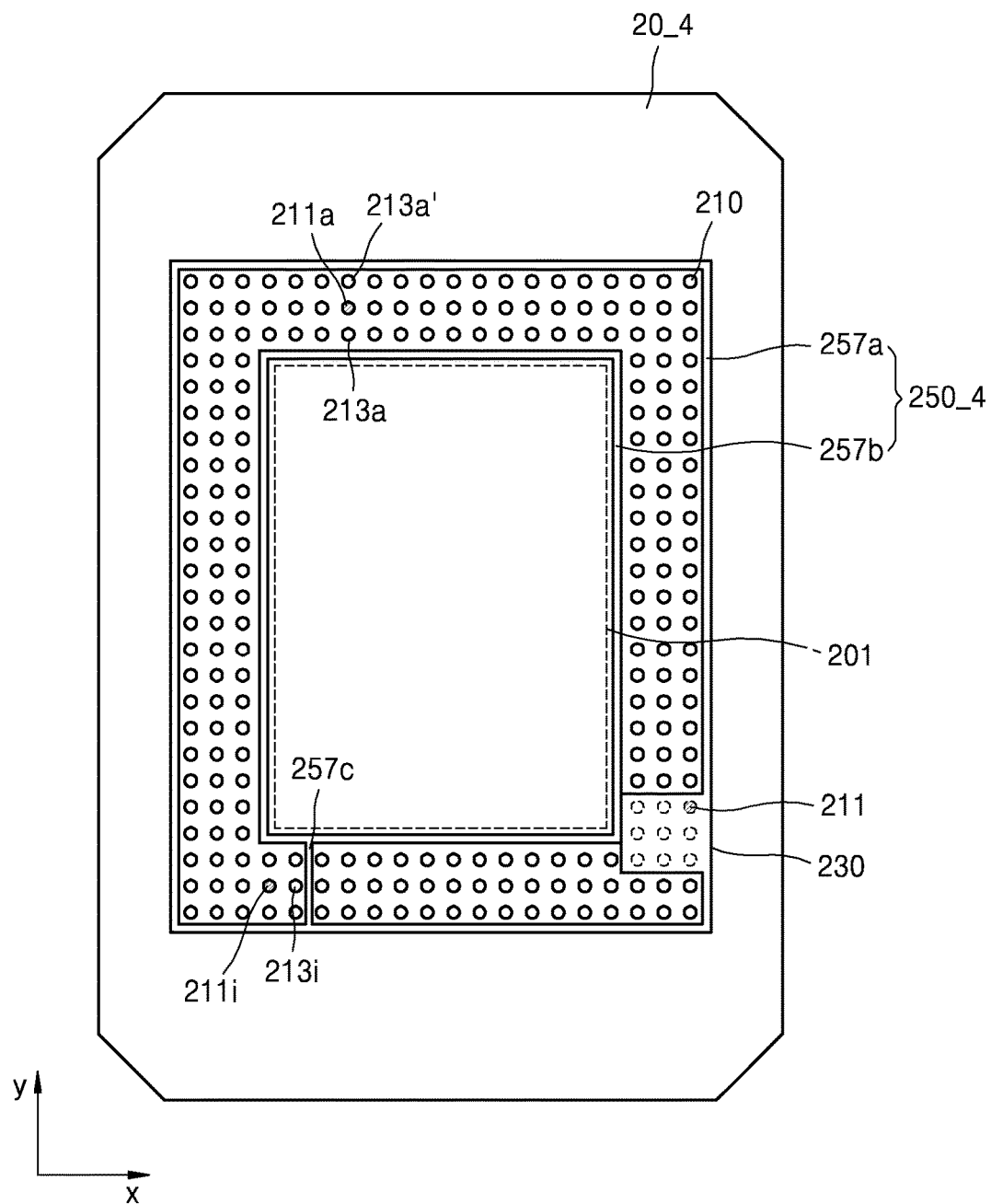

FIG. 9 is a plan view of an array of the terminals 210 of a test socket 20_4 according to another example embodiment.

Referring to FIG. 9, a ground line 250_4 of the test socket 20_4 may include a first ground line 257*a* extending along with an exterior of the terminals 210, and a second ground line 257*b* extending along with the blank region 201. The first and second ground lines 257*a* and 257*b* may be in parallel with each other at least partially. Also, the first ground line 257*a* may extend along with the exterior of the array of terminals 210 so as to surround the array of terminals 210. In addition, the second ground line 257*b* may extend along with an exterior of the blank region 201 so as to surround the blank region 201.

When the ground line 250_4 is formed as described above, the signal characteristic improvement to a minimum extent may be ensured by the ground lines 250_4 disposed on opposite sides of the signal terminals 213*a* and 213*a'* wherever the signal terminals 213*a* and 213' are located. In more detail, if the signal terminal 213*a'* is located at the outermost part, the first ground line 257*a* is adjacent to the signal terminal 213*a'* and the signal terminal 213*a'* may be located between the first ground line 257*a* and the ground terminal 211*a*. Also, if the signal terminal 213*a* is located at the innermost part, the second ground line 257*b* is adjacent to the signal terminal 213*a* and the signal terminal 213*a* may be located between the second ground line 257*b* and the ground terminal 211*a*. Therefore, the signal terminals 213*a* and 213*a'* may have excellent signal characteristics.

Also, the ground line 250_4 may further include a third ground line 257*c* connecting the first ground line 257*a* and the second ground line 257*b* to each other. A signal terminal 213*i* adjacent to the third ground line 257*c* may have excellent signal characteristic due to the third ground line 257*c* and a ground terminal 211*i* at an opposite side to the third ground line 257*c*.

Arrangement of terminals of the test substrate 10, on which the test socket 20_4 is mounted, may correspond to the arrangement of the terminal 210 of the test socket 20_4, but is not limited thereto.

Figure 10:
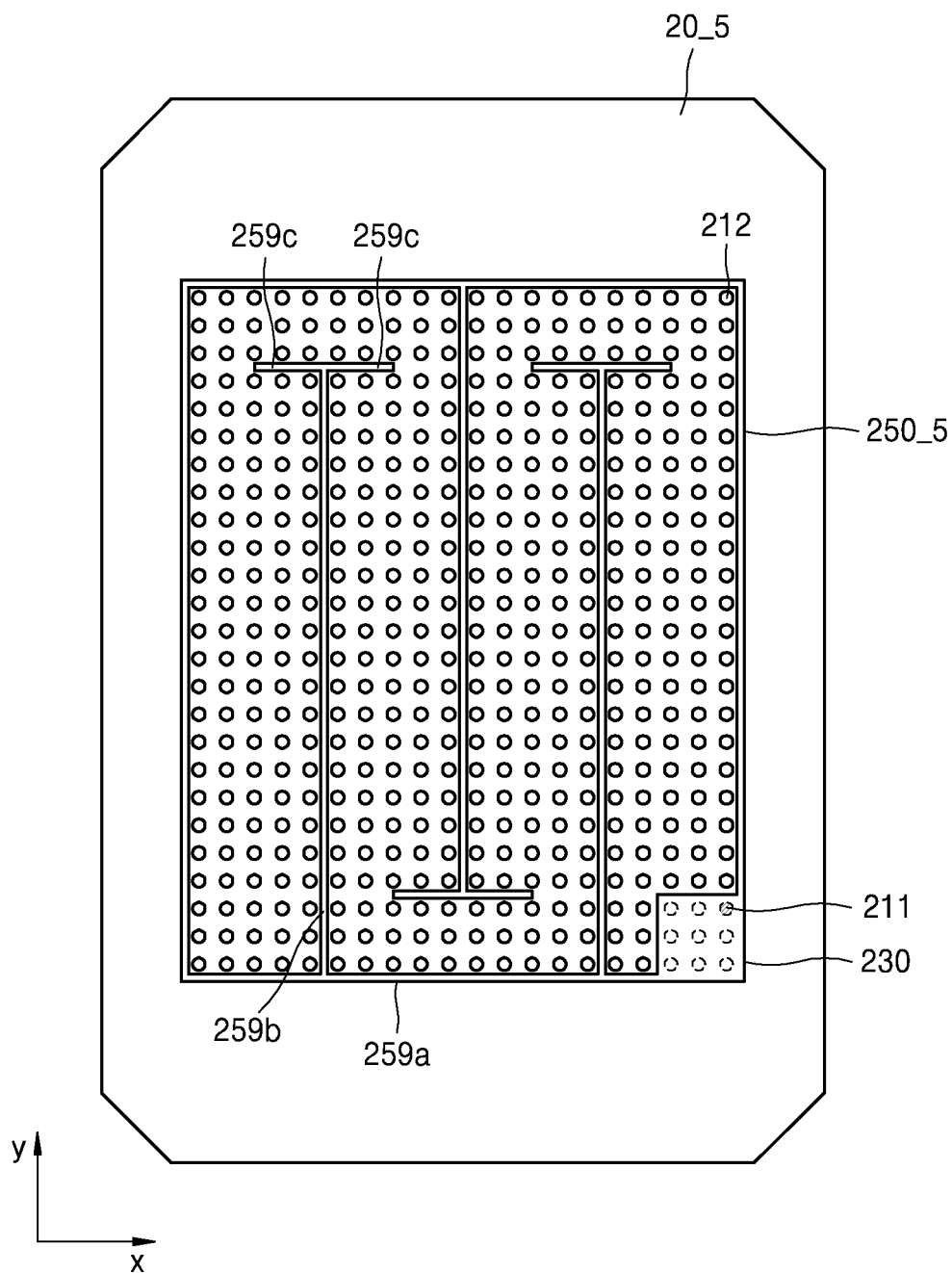

FIG. 10 is a plan view of an array of terminals 212 in a test socket 20_5 according to another example embodiment.

Referring to FIG. 10, the terminals 212 may be arranged two-dimensionally without forming the blank region, unlike the example embodiments of FIGS. 5 through 9. Pitches between the terminals 212 in the x-axis direction and pitches between the terminals 212 in the y-axis direction may be constant, respectively. Also, the pitches between the terminals 212 in the x-axis direction and the y-axis direction may be the same as each other.

Also, a ground line 250_5 may extend along with at least a part of exterior of the terminals 212. Moreover, the ground line 250_5 may extend to surround the exterior of the terminals 212. The ground line 250_5 may be electrically connected to at least one ground terminal 211 via the ground extension portion 230.

The ground line 250_5 may have a first portion 259*a* extending along with the exterior of the terminals 212, and second portions 259*b* branched from the first portion 259*a* and extending in a direction that is not in parallel with the first portion 259*a*. A direction in which the first portion 259*a* extends and a direction in which the second portions 259*b* extend may be perpendicular to each other.

The ground line 250_5 may further include third portions 259*c* that are branched from the second portions 259*b* and extend in a direction that is not in parallel with the second portions 259*b*.

The ground line 250_5 may include a plurality of the first portions 259*a*, a plurality of the second portions 259*b*, and a plurality of the third portions 259*c*.

The signal characteristics may be improved when the ground line 250_5 is formed as described above with reference to FIGS. 5 through 9, and thus, detailed descriptions are omitted.

Arrangement of terminals of the test substrate 10, on which the test socket 20_5 is mounted, may correspond to the arrangement of the terminals 212 of the test socket 20_5, but is not limited thereto.

Figure 11:
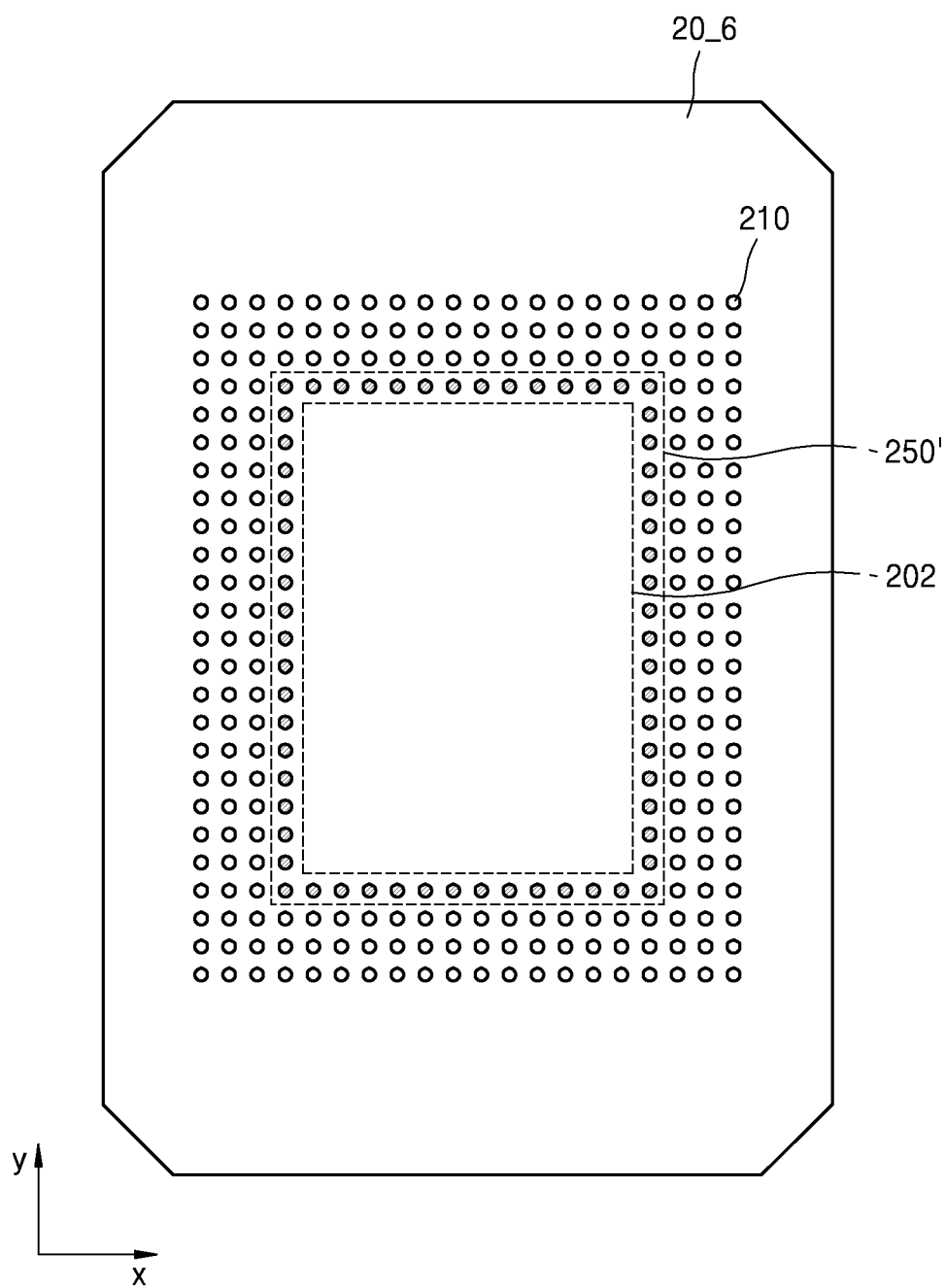

FIG. 11 is a plan view of an array of the terminals 210 in a test socket 20_6 according to another example embodiment.

Referring to FIG. 11, instead of the ground lines 250 and 250_3 shown in FIGS. 5 and 8, a series of ground terminals 250' may be provided. The series of ground terminals 250' may be provided along with the exterior of the blank region 202, or the exterior of the array of terminals 210, or both. In FIG. 11, the series of ground terminals 250' are arranged along with the exterior of the blank region 202, but are not limited thereto.

The series of ground terminals 250' may be electrically connected to each other via an inside of the test socket 20_6 or a rear surface of the test socket 20_6. In addition, at least one selected from the series of ground terminals 250' may be electrically connected to at least one ground terminal from among the terminals 210.

Arrangement of terminals of the test substrate 10, on which the test socket 20_6 is mounted, may correspond to the arrangement of the terminals 210 of the test socket 20_6, but is not limited thereto.

In the example embodiments shown in FIGS. 5 through 11, the arrangement of the terminals in the test socket 20_1, 20_2, 20_3, 20_4, 20_5, or 20_6 and the arrangement of the terminals in the test substrate 10 may be different from each other. In addition, configuration of the ground lines of the test socket 20_1, 20_2, 20_3, 20_4, 20_5, or 20_6 and configuration of the ground lines of the test substrate 10 may not correspond to each other, and various modified examples including the present example embodiments shown in FIGS. 5 through 11 may be combined.

Figure 12:
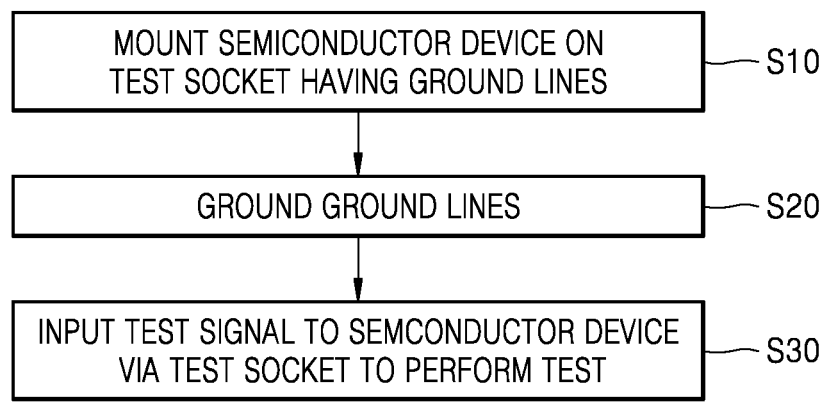
FIG. 12 illustrates a flowchart illustrating a method of testing a semiconductor device by using a test socket according to an example embodiment.

FIG. 12 is a flowchart illustrating a method of testing a semiconductor device by using the test socket according to an example embodiment.

Referring to FIG. 12, a semiconductor device is installed on the test socket including a two-dimensional array of a plurality of terminals, and a ground line extending along with at least one line in the two-dimensional array of the terminals (S10).

The test socket may be one of the test sockets described above with reference to FIGS. 5 through 11.

Next, the ground line may be grounded (S20). For example, the ground line may be electrically connected to a ground terminal included in a test device of the semiconductor device to be grounded.

The two-dimensional array of the terminals may include at least one ground terminal. In addition, the two-dimensional array of the terminals may include a plurality of signal lines, at least one of which may be located between the at least one ground terminal and the ground line.

In addition, a test signal is input to the semiconductor device via the test socket to perform a test of the semiconductor device (S30). The test signal may be designed exclusively for the semiconductor device.

When the test signal is input, a transmission loss of the signal transmitted through the signal terminal that is located between the ground terminal and the ground line may be improved higher than that of a case where there is no ground line. That is, the signal transmission characteristic of the signal terminal may be improved by the ground line.

By way of summation and review, reliability tests generally include an electrical property test for checking the semiconductor apparatus with regard to the electrical characteristics and defects thereof. To do this, input/output terminals of the semiconductor apparatus are placed in contact with a test circuit board including a test signal generation circuit so as to check whether the semiconductor apparatus operates normally and if a disconnection occurred therein. Test technology should be further developed in order to deal with semiconductor devices operating at high speed.

As described above, embodiments relate to a test socket for semiconductor devices, the test socket enabling high speed operations with excellent signal transmission characteristics, and a test device including the test socket. Thus, the test of the semiconductor device may be performed effectively.

Embodiments may provide a test device capable of operating at high speed with an excellent signal transmission characteristic.

Embodiments may provide a test socket for a semiconductor device, the test socket enabling the semiconductor device to operate at high speed with excellent signal transmission characteristic.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A test device for testing a semiconductor device, the test device comprising:
a test main body for testing the semiconductor device; and
a test control unit for controlling a test performed via the test main body,
the test main body including a test substrate and a test socket on the test substrate,
the test socket having a first surface that comes in detachable contact with the semiconductor device to be tested, a second surface opposite the first surface, and a two-dimensional array of terminals that are vertically aligned with and correspond to terminals of the semiconductor device, the test socket including a ground line extending along at least one row of the terminals in the two-dimensional array of the terminals; and
the test substrate being electrically connected to the two-dimensional array of terminals of the test socket so as to transmit and receive a test signal,
wherein the terminals arranged in the two-dimensional array of the test socket surround a blank region where no terminal is arranged, and the ground line extends along four sides of the blank region.

2. The test device as claimed in claim 1, wherein the two-dimensional array has an external square shape, and the ground line extends along at least a part of the external square shape of the two-dimensional array.

3. The test device as claimed in claim 2, wherein the ground line surrounds the external square shape of the two-dimensional array.

4. The test device as claimed in claim 2, wherein the ground line includes a first portion positioned along at least a part of the external square shape of the two-dimensional array and a second portion branching from the first portion and extending in a non-parallel direction with the first portion.

5. The test device as claimed in claim 4, wherein the ground line includes two or more second portions.

6. The test device as claimed in claim 4, wherein the second portion branches perpendicularly from the first portion.

7. The test device as claimed in claim 4, wherein the second portion extends between the terminals.

8. The test device as claimed in claim 1, wherein:
the terminals arranged in the two-dimensional array include a ground terminal, and one signal terminal is located between the ground line and the ground terminal, and
a distance between the signal terminal and the ground line is about 0.5 times to 5 times a pitch between the terminals.

9. The test device as claimed in claim 1, wherein the ground line surrounds the blank region.

10. The test device as claimed in claim 1, wherein the ground line includes a third portion along at least a part of the external area of the blank region, and a fourth portion branching from the third portion and extending in a non-parallel direction with the third portion.

11. The test device as claimed in claim 1, wherein the ground line extends between two adjacent columns of the two-dimensional array.

12. The test device as claimed in claim 11, wherein the ground line includes a fifth portion extending between two adjacent columns of the two-dimensional array, and a sixth portion branching from the fifth portion and extending between other two adjacent columns of the two-dimensional array.

13. The test device as claimed in claim 12, wherein the ground line further includes a seventh portion branching from the fifth portion in a direction opposite a direction in which the sixth portion extends.

14. The test device as claimed in claim 13, wherein the sixth portion and the seventh portion are branching from a point on the fifth portion in opposite directions to each other.

15. A test socket, comprising:
a first surface that comes in detachable contact with a semiconductor device to be tested and a second surface opposite the first surface;
terminals arranged in a two-dimensional array and corresponding to terminals of the semiconductor device, the terminals including at least one ground terminal; and
a ground line that extends along at least one row of the two-dimensional array, the ground line being electrically connected to the at least one ground terminal,
wherein the terminals arranged in the two-dimensional array of the test socket surround a blank region where no terminal is arranged, and the ground line extends continuously along four sides of the blank region except for a single gap, such that the ground line is interrupted at the gap.

* * * * *